US009992834B2

(12) United States Patent
Kawase et al.

(10) Patent No.: US 9,992,834 B2
(45) Date of Patent: *Jun. 5, 2018

(54) LIGHT-EMITTING ELEMENT DRIVING DEVICE, LIGHT-EMITTING DEVICE, AND VEHICLE

(71) Applicant: Rohm Co., Ltd., Kyoto (JP)

(72) Inventors: Shigenori Kawase, Kyoto (JP); Shinsuke Takagimoto, Kyoto (JP); Yoshiyuki Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/518,940

(22) PCT Filed: Sep. 25, 2015

(86) PCT No.: PCT/JP2015/077016
§ 371 (c)(1),
(2) Date: Apr. 13, 2017

(87) PCT Pub. No.: WO2016/059954
PCT Pub. Date: Apr. 21, 2016

(65) Prior Publication Data
US 2017/0238384 A1   Aug. 17, 2017

(30) Foreign Application Priority Data
Oct. 17, 2014   (JP) .................................. 2014-212495

(51) Int. Cl.
*B60Q 1/02*   (2006.01)
*H05B 33/08*   (2006.01)
(Continued)

(52) U.S. Cl.
CPC ............ *H05B 33/0842* (2013.01); *B60Q 1/04* (2013.01); *B60Q 1/30* (2013.01); *B60Q 1/34* (2013.01); *B60Q 3/80* (2017.02); *H05B 33/0896* (2013.01)

(58) Field of Classification Search
None
See application file for complete search history.

(56) References Cited

U.S. PATENT DOCUMENTS 8,593,835 B2 * 11/2013 Eom ................... H02M 3/3376
363/21.04
2011/0062870 A1   3/2011 Kanbara
(Continued)

FOREIGN PATENT DOCUMENTS

| JP | 2003-332091 | 11/2003 |
|----|-------------|---------|
| JP | 2009-283401 | 12/2009 |

(Continued)

OTHER PUBLICATIONS

PFET step-down controller for driving large current LED, National Semiconductor Corporation, LM3409/LM3409HV LM3409Q/LM3409QHV PFET Buck Controller for High Power LED Drivers, Texas Instruments, 75 pages (2010) (with English translation).

*Primary Examiner* — Anh Tran
(74) *Attorney, Agent, or Firm* — Fish & Richardson P.C.

(57) ABSTRACT

A light-emitting element driving device includes a reset signal generation unit that generates a reset signal in accordance with current flowing in a light-emitting element, a set signal generation unit that generates a set signal in accordance with the anode voltage of the light-emitting element, and an output voltage supply unit that generates an output voltage from an input voltage in accordance with the reset signal and the set signal, so as to supply the output voltage to the light-emitting element. The set signal generation unit includes a current generation unit that generates current (Continued)

according to the anode voltage of the light-emitting element, a charging unit that charges the current generated by the current generation unit, and a comparator that generates the set signal in accordance with a comparison result between a charging voltage of the charging unit and a reference voltage.

20 Claims, 13 Drawing Sheets

(51) Int. Cl.
  *B60Q 1/34* (2006.01)
  *B60Q 1/30* (2006.01)
  *B60Q 1/04* (2006.01)
  *B60Q 3/80* (2017.01)

(56) References Cited

U.S. PATENT DOCUMENTS

2011/0316449 A1* 12/2011 Imanaka ............ H05B 33/0815
  315/307
2013/0134894 A1* 5/2013 Kuang .................. H05B 37/02
  315/224

FOREIGN PATENT DOCUMENTS

| | | |
|---|---|---|
| JP | 2010-273447 | 12/2010 |
| JP | 2012-174649 | 9/2012 |
| JP | 2013-157238 | 8/2013 |

* cited by examiner

LIGHT-EMITTING ELEMENT DRIVING DEVICE, LIGHT-EMITTING DEVICE, AND VEHICLE

TECHNICAL FIELD

The present invention relates to a light-emitting element driving device that drives a light-emitting element, a light-emitting device using the light-emitting element driving device, and a vehicle using the light-emitting element driving device.

BACKGROUND ART

FIG. 12 is a diagram illustrating an example of a light-emitting device. The light-emitting device illustrated in FIG. 12 includes at least one light-emitting element (light emitting diodes in FIG. 12) Z1, and a light-emitting element driving device that drives the light-emitting element Z1.

In the light-emitting element driving device included in the light-emitting device illustrated in FIG. 12, a control unit 3 controls an upper-side driver 2H and a lower-side driver 2L to turn on and off N-channel MOS field-effect transistors 1H and 1L (hereinafter referred to as an upper-side transistor 1H and a lower-side transistor 1L), in accordance with a reset signal RESET output from a comparator COM1 and a set signal SET output from a comparator COM2. In this way, a voltage (switch voltage Vsw) at a connection node between the upper-side transistor 1H and the lower-side transistor 1L is generated.

When output current Io that flows in the light-emitting element Z1 exceeds a threshold value, the reset signal RESET output from the comparator COM1 rises, and just after that the output current Io decreases so that the reset signal RESET falls.

An anode voltage Vom of the light-emitting element Z1 is integrated by an RC integral circuit constituted of a resistor $R_{OFF}$ and a capacitor $C_{OFF}$. When the integrated value exceeds a reference voltage $V_{REF}$, the set signal SET output from the comparator COM2 rises, and just after that the capacitor $C_{OFF}$ is discharged by a discharge circuit (not shown) so that the set signal SET falls. After that, when the reset signal RESET output from the comparator COM1 rises, the discharge of the capacitor $C_{OFF}$ by the discharge circuit (not shown) is finished.

When the set signal SET rises, the control unit 3 turns on the upper-side transistor 1H and turns off the lower-side transistor 1L. In addition, when the reset signal RESET rises, the control unit 3 turns off the upper-side transistor 1H and turns on the lower-side transistor 1L.

FIGS. 13A and 13B are time charts for describing an operation example of the light-emitting device illustrated in FIG. 12, in which the switch voltage Vsw, the output current Io, the reset signal RESET, and the set signal SET are shown in order from top to bottom. FIG. 13A is a time chart in the case where the number of elements connected in series in the light-emitting element Z1 is large so that the anode voltage Vom of the light-emitting element Z1 is high. FIG. 13B is a time chart in the case where the number of elements connected in series in the light-emitting element Z1 is small so that the anode voltage Vom of the light-emitting element Z1 is low.

An off-time $t_{OFF}$ that is a low level period of the switch voltage Vsw can be expressed by the following equation (1). Note that, in the following equation (1), $R_{OFF}$, $C_{OFF}$, and $V_{COFF}$ respectively represent a resistance of the resistor $R_{OFF}$, a capacitance of the capacitor $C_{OFF}$, and a voltage across the capacitor $C_{OFF}$ (i.e. an integrated value of the anode voltage Vom of the light-emitting element Z1).

[Mathematical 1]

$$t_{OFF} = -R_{OFF} \times C_{OFF} \times \ln\left(1 - \frac{V_{REF}}{V_{COFF}}\right) \quad (1)$$

LIST OF CITATIONS

Non-Patent Literature

Non-Patent Document 1: "PFET step-down controller for driving large current LED", online, April 2010, National Semiconductor Corporation, searched on Sep. 29, 2014, the Internet URL: http://www.tij.co.jp/jp/lit/ds/symlink/lm3409.pdf

SUMMARY OF THE INVENTION

Problem to be Solved by the Invention

The above equation (1) is nonlinear, though close to linear. However, if the anode voltage Vom of the light-emitting element Z1 is high, the above equation (1) becomes very close to linear, while if the anode voltage Vom of the light-emitting element Z1 is low, the deviation from linear of the above equation (1) becomes conspicuous due to influence of transient characteristics of the RC integral circuit (see FIG. 14).

Therefore there is a problem that an average value of the output current Io must be constant regardless of the anode voltage Vom of the light-emitting element Z1 in theory, but the average value of the output current Io is decreased in reality if the anode voltage Vom of the light-emitting element Z1 is low. Note that the light-emitting device disclosed in Non-Patent Document 1 also has the same problem as the light-emitting device illustrated in FIG. 12.

In view of the above circumstances, it is an object of the present invention to provide a light-emitting element driving device that can suppress a variation in the average value of the output current due to a variation in the anode voltage of the light-emitting element, a light-emitting device using the light-emitting element driving device, and a vehicle using the light-emitting element driving device.

Means for Solving the Problem

In order to achieve the above-mentioned object, a light-emitting element driving device according to the present invention includes a reset signal generation unit arranged to generate a reset signal in accordance with current flowing in at least one light-emitting element, a set signal generation unit arranged to generate a set signal in accordance with an anode voltage of the at least one light-emitting element, and an output voltage supply unit arranged to generate an output voltage from an input voltage in accordance with the reset signal and the set signal so as to supply the output voltage to the at least one light-emitting element. The set signal generation unit includes a current generation unit arranged to generate current according to the anode voltage of the at least one light-emitting element, a charging unit arranged to charge the current generated by the current generation unit, and a comparing unit arranged to generate the set signal in accordance with a comparison result between a charging voltage of the charging unit and a reference voltage (first structure).

Note that the light-emitting element driving device having the first structure described above preferably has a structure in which a detection unit arranged to detect a level of the anode voltage of the at least one light-emitting element is disposed, and an internal constant of the set signal generation unit is switched in accordance with a detection result of the detection unit (second structure).

In addition, the light-emitting element driving device having the second structure described above preferably has a structure in which the current generation unit includes a voltage dividing unit arranged to divide the anode voltage of the at least one light-emitting element, and switches a voltage division ratio of the voltage dividing unit and a capacitance of the charging unit in accordance with the detection result of the detection unit (third structure).

In addition, the light-emitting element driving device having the third structure described above preferably has a structure in which the product of the voltage division ratio of the voltage dividing unit and the capacitance of the charging unit is constant (fourth structure).

In addition, the light-emitting element driving device having the second structure described above preferably has a structure in which the set signal generation unit further includes a reference voltage source arranged to output the reference voltage, and the current generation unit includes a voltage dividing unit arranged to divide the anode voltage of the at least one light-emitting element, and switches a voltage division ratio of the voltage dividing unit and the reference voltage in accordance with the detection result of the detection unit (fifth structure).

In addition, the light-emitting element driving device having the fifth structure described above preferably has a structure in which the product of the voltage division ratio of the voltage dividing unit and the reference voltage is constant (sixth structure).

In addition, the light-emitting element driving device having any one of the first to sixth structures described above preferably has a structure in which the output voltage generation unit includes an upper-side transistor and a lower-side transistor connected in series between an application terminal of the input voltage and the ground terminal, the connection node thereof being connected to the output capacitor via a coil, an upper-side driver and a lower-side driver arranged to generate drive control signals of the upper-side transistor and the lower-side transistor, respectively, and a control unit arranged to control the upper-side driver and the lower-side driver to turn on and off the upper-side transistor and the lower-side transistor, respectively, in accordance with the reset signal and the set signal (seventh structure).

In addition, a light-emitting device according to the present invention includes the light-emitting element driving device having any one of the first to seventh structures described above, and at least one light-emitting element driven by the light-emitting element driving device (eighth structure).

In addition, the light-emitting device having the eighth structure described above preferably has a structure in which at least one switch connected in parallel to each element of the at least one light-emitting element is disposed, and the set signal generation unit further includes a current source arranged to supply current to the charging unit if every switch of the at least one switch is turned on (ninth structure).

Note that the light-emitting device having the eighth or ninth structure described above preferably has a structure in which the light-emitting element is a light emitting diode or an organic EL element (tenth structure).

In addition, the light-emitting device having the tenth structure described above preferably has a structure in which the light-emitting device is used as an in-vehicle lamp (eleventh structure).

In addition, the light-emitting device having the eleventh structure described above preferably has a structure in which the light-emitting device is mounted in a vehicle as a headlight module, a turn lamp module, or a rear lamp module (twelfth structure).

In addition, a vehicle according to the present invention includes the light-emitting device according to the eleventh or twelfth structure (thirteenth structure).

In addition, the vehicle having the thirteenth structure described above preferably has a structure in which the light-emitting device is used as at least one of a headlight, a day and night running light source, a tail lamp, a stop lamp, and a turn lamp (fourteenth structure).

Effects of the Invention

According to the present invention, it is possible to provide a light-emitting element driving device that can suppress a variation in the average value of the output current due to a variation in the anode voltage of the light-emitting element, a light-emitting device using the light-emitting element driving device, and a vehicle using the light-emitting element driving device.

DESCRIPTION OF EMBODIMENTS

First Embodiment

Figure 1A:
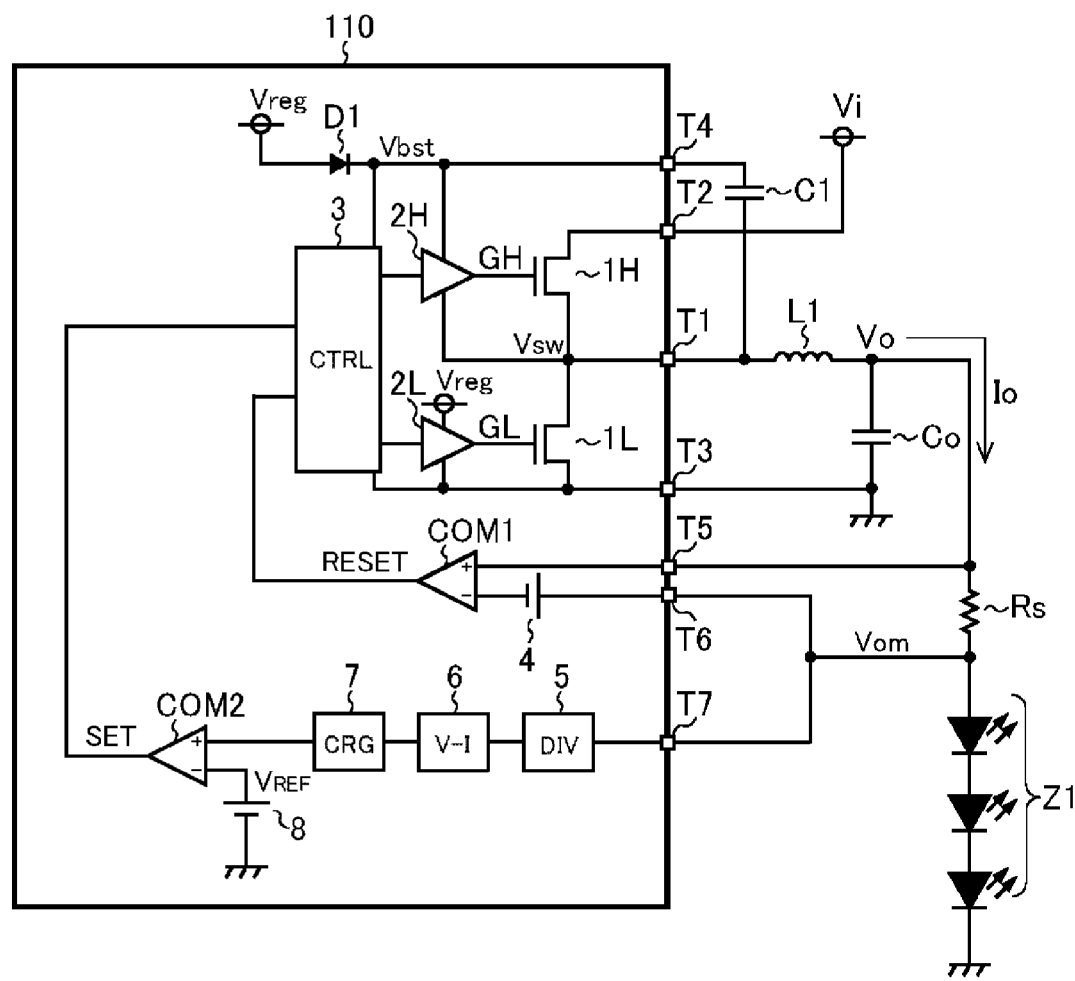
FIG. 1A is a diagram illustrating a light-emitting device of a first embodiment.

FIG. 1A is a diagram illustrating a light-emitting device of a first embodiment.

The light-emitting device illustrated in FIG. 1A includes at least one light-emitting element (light emitting diodes in FIG. 1A) Z1, a light-emitting element drive IC 110 that drives the light-emitting element Z1, a coil L1, an output capacitor Co, a sense resistor Rs, and a capacitor C1.

The light-emitting element drive IC 110, which is a semiconductor integrated circuit device (so-called LED driver IC), includes integration of N-channel MOS field-effect transistors 1H and 1L (hereinafter referred to as an upper-side transistor 1H and a lower-side transistor 1L), an upper-side driver 2H and a lower-side driver 2L, a diode D1, a control unit 3, a constant voltage source 4, a comparator COM1, a voltage dividing circuit 5, a voltage-current conversion circuit 6, a charging unit 7, a comparator COM2, and a reference voltage source 8. In addition, the light-emitting element drive IC 110 has external terminals T1 to T7 so as to establish external electrical connection. Note that a part of circuit elements in the light-emitting element drive IC 110 may be replaced by externally connected elements.

In the outside of the light-emitting element drive IC 110, the external terminal T2 is connected to an application terminal of an input voltage Vi. The external terminal T1 is connected to a first terminal of the coil L1. A second terminal of the coil L1 (application terminal of an output voltage Vo) is connected to a first terminal of the sense resistor Rs. A second terminal of the sense resistor Rs is connected to a first terminal (anode) of the light-emitting element Z1. A second terminal (cathode) of the light-emitting element Z1 is connected to a ground terminal. A first terminal of the output capacitor Co is connected to the second terminal of the coil L1. A second terminal of the output capacitor Co is connected to the ground terminal. The external terminal T3 is connected to the ground terminal. The external terminal T4 is connected to the first terminal of the coil L1 via the capacitor C1. The external terminal T5 is connected to the first terminal of the sense resistor Rs. The external terminals T6 and T7 are connected to the first terminal (anode) of the light-emitting element Z1.

Inside the light-emitting element drive IC 110, the drain of the upper-side transistor 1H is connected to the external terminal T2. The source of the upper-side transistor 1H is connected to the external terminal T1. The gate of the upper-side transistor 1H is connected to an output terminal of the upper-side driver 2H. The drain of the lower-side transistor 1L is connected to the external terminal T1. The source of the lower-side transistor 1L is connected to the external terminal T3. The gate of the lower-side transistor 1L is connected to an output terminal of the lower-side driver 2L. In other words, the upper-side transistor 1H and the lower-side transistor 1L are connected in series between the application terminal of the input voltage Vi and the ground terminal, and a connection node between them (application terminal of the switch voltage Vsw) is connected to the output capacitor Co via the coil L1.

The upper-side driver 2H generates a control signal GH of the upper-side transistor 1H based on an instruction from the control unit 3. The upper-side transistor 1H is turned on when the control signal GH is high level and is turned off when the control signal GH is low level. The lower-side driver 2L generates a control signal GL of the lower-side transistor 1L based on an instruction from the control unit 3.

The lower-side transistor 1L is turned on when the control signal GL is high level and is turned off when the control signal GL is low level.

The diode D1 and the capacitor C1 externally connected to the light-emitting element drive IC 110 constitute a bootstrap circuit. The bootstrap circuit generates a boost voltage Vbst. The anode of the diode D1 is connected to an application terminal of a constant voltage Vreg. The cathode of the diode D1 is connected to the external terminal T4.

A first power supply terminal of the upper-side driver 2H and a first power supply terminal of the control unit 3 are connected to the external terminal T4 (application terminal of the boost voltage Vbst). A second power supply terminal of the upper-side driver 2H is connected to the external terminal T1 (application terminal of the switch voltage Vsw). Therefore, high level of the control signal GH applied to the gate of the upper-side transistor 1H is the boost voltage Vbst, and low level of the control signal GH is the switch voltage Vsw.

A first power supply terminal of the lower-side driver 2L is connected to an application terminal of the constant voltage Vreg. A second power supply terminal of the lower-side driver 2L is connected to the external terminal T3 (application terminal of the ground voltage GND). Therefore, high level of the control signal GL applied to the gate of the lower-side transistor 1L is the constant voltage Vreg, and low level of the control signal GL is the ground voltage GND.

An operation of the bootstrap circuit having the above-mentioned structure is described. When the upper-side transistor 1H is turned off and the lower-side transistor 1L is turned on, if the switch voltage Vsw is low level (GND) the capacitor C1 is charged by the current that flows from the application terminal of the constant voltage Vreg to the capacitor C1 via the diode D1. In this case, the boost voltage Vbst becomes substantially the constant voltage Vreg (more correctly, a value (Vreg–Vf) obtained by subtracting a forward drop voltage Vf of the diode D1 from the constant voltage Vreg).

On the other hand, in the state where the capacitor C1 is charged, when the upper-side transistor 1H is turned on while the lower-side transistor 1L is turned off, the switch voltage Vsw is raised from low level (GND) to high level (Vi). Then, the boost voltage Vbst is raised to a value (Vi+Vreg) higher than high level (Vi) of the switch voltage Vsw by a charge voltage of the capacitor C1 (substantially Vreg). Because this boost voltage Vbst is applied to the first power supply terminal of the upper-side driver 2H, the upper-side transistor 1H can be securely turned on and off.

The comparator COM1 makes the reset signal RESET as the output signal be high level when the voltage that is the sum of the voltage across the sense resistor Rs and the constant voltage of the constant voltage source 4 exceeds a predetermined voltage. If the voltage that is the sum of the voltage across the sense resistor Rs and the constant voltage of the constant voltage source 4 is not higher than the predetermined voltage, the comparator COM1 makes the reset signal RESET as the output signal be low level. Therefore, the output current Io that flows in the light-emitting element Z1 exceeds a threshold value, the reset signal RESET output from the comparator COM1 rises, and just after that, the output current Io is decreased so that the reset signal RESET falls.

The voltage dividing circuit 5 divides the anode voltage Vom of the light-emitting element Z1, so as to supply the divided voltage to the voltage-current conversion circuit 6. The voltage-current conversion circuit 6 generates current corresponding to the divided voltage of the anode voltage Vom of the light-emitting element Z1, so as to supply the current to the charging unit 7. The charging unit 7 charges the current (charge) supplied from the voltage-current conversion circuit 6. Note that, if the anode voltage Vom of the light-emitting element Z1 is low, it is possible to adopt a structure different from this example, in which the voltage dividing circuit 5 is not disposed, and the anode voltage Vom of the light-emitting element Z1 is supplied to the voltage-current conversion circuit 6.

When a charge voltage of the charging unit 7 exceeds the reference voltage $V_{REF}$ output from the reference voltage source 8, the set signal SET output from the comparator COM2 rises, and just after that, the charging unit 7 is discharged by the discharge circuit (not shown in FIG. 1A) so that the set signal SET falls. After that, when the reset signal RESET output from the comparator COM1 rises, discharge of the charging unit 7 by the discharge circuit (not shown in FIG. 1A) is finished.

The control unit 3 controls the upper-side driver 2H and the lower-side driver 2L to turn on and off the upper-side transistor 1H and the lower-side transistor 1L, in accordance with the reset signal RESET output from the comparator COM1 and the set signal SET output from the comparator COM2. In this way, the voltage (switch voltage Vsw) at the connection node between the upper-side transistor 1H and the lower-side transistor 1L is generated.

When the set signal SET rises, the control unit 3 turns on the upper-side transistor 1H and turns off the lower-side transistor 1L. In addition, when the reset signal RESET rises, the control unit 3 turns off the upper-side transistor 1H and turns on the lower-side transistor 1L.

In the light-emitting device illustrated in FIG. 1A having the structure described above, the off-time circuit that determines an off-time $t_{OFF}$ as the low level period of the switch voltage Vsw is constituted of the voltage dividing circuit 5, the voltage-current conversion circuit 6, the charging unit 7, the comparator COM2, and the reference voltage source 8, without using an RC integral circuit. Therefore, the off-time $t_{OFF}$ can be expressed by the following equation (2) and is not affected by the transient characteristics of the RC integral circuit. Therefore, it is possible to suppress a variation in the average value of the output current Io due to a variation in the anode voltage of the light-emitting element Z1 (ideally to prevent the average value of the output current Io from being varied). Note that C and I in the following equation (2) respectively represent a capacitance of the charging unit 7 and current output from the voltage-current conversion circuit 6.

[Mathematical 2]

$$t_{OFF} = \frac{C}{I} \times V_{REF} \quad (2)$$

Figure 2A:
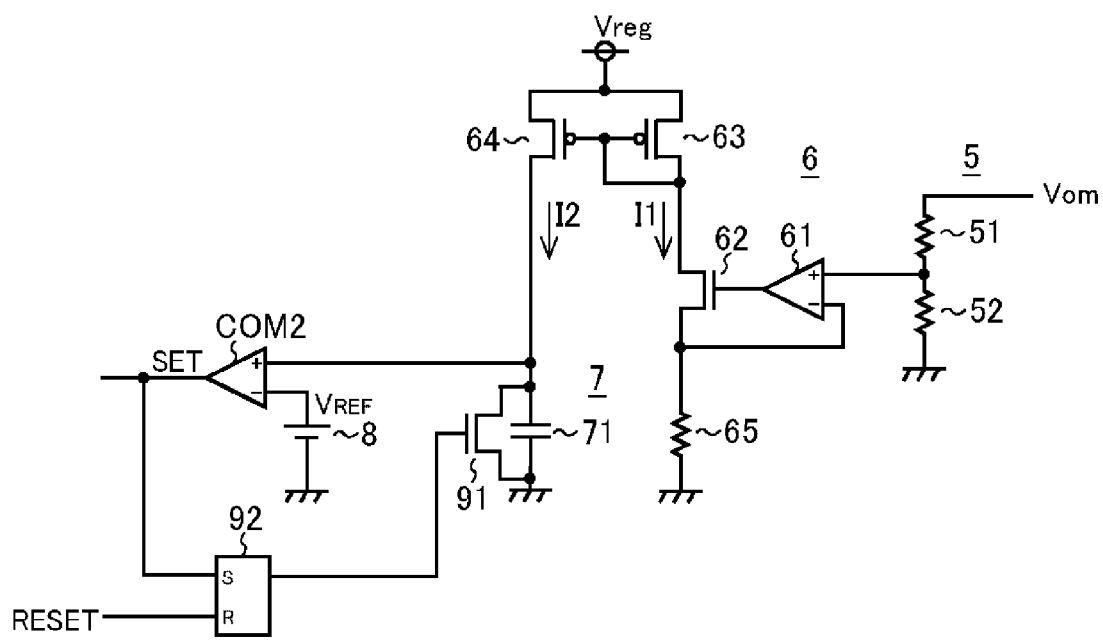
FIG. 2A is a diagram illustrating an example of an off-time circuit.

FIG. 2A is a diagram illustrating an example of the off-time circuit constituted of the voltage dividing circuit 5, the voltage-current conversion circuit 6, the charging unit 7, the comparator COM2, and the reference voltage source 8.

The voltage dividing circuit 5 is constituted of resistors 51 and 52 so as to divide the anode voltage Vom of the light-emitting element Z1.

The voltage-current conversion circuit 6 includes an amplifier 61, an N-channel MOS field-effect transistor 62, P-channel MOS field-effect transistors 63 and 64, and a resistor 65. The amplifier 61 and the transistor 62 generate current I1 corresponding to the divided voltage of the anode voltage Vom of the light-emitting element Z1, and the current I1 flows to the ground terminal via a resistor 65.

In addition, a current mirror circuit constituted of the transistors 63 and 64 generates current I2 that is proportional to the current I1 (current I2 corresponding to the divided voltage of the anode voltage Vom of the light-emitting element Z1), and the current I2 is supplied to the capacitor 71 as the charging unit 7.

FIG. 2A also illustrates the discharge circuit constituted of an N-channel MOS field-effect transistor 91 and an SR flip-flop 92.

The drain of the transistor 91 is connected to a first terminal of the capacitor 71 (connection terminal to the transistor 64) and the source of the transistor 91 is connected to a second terminal of the capacitor 71 (ground terminal).

A set terminal of the SR flip-flop 92 is supplied with the set signal SET output from the comparator COM2, and a reset terminal of the SR flip-flop 92 is supplied with the reset signal RESET output from the comparator COM1. An output signal of the SR flip-flop 92 is supplied to the gate of the transistor 91. In this way, the transistor 91 is turned on just after the set signal SET rises, and the capacitor 71 is discharged. After that, the discharge of the capacitor 71 continues until the reset signal RESET rises.

Figure 1B:
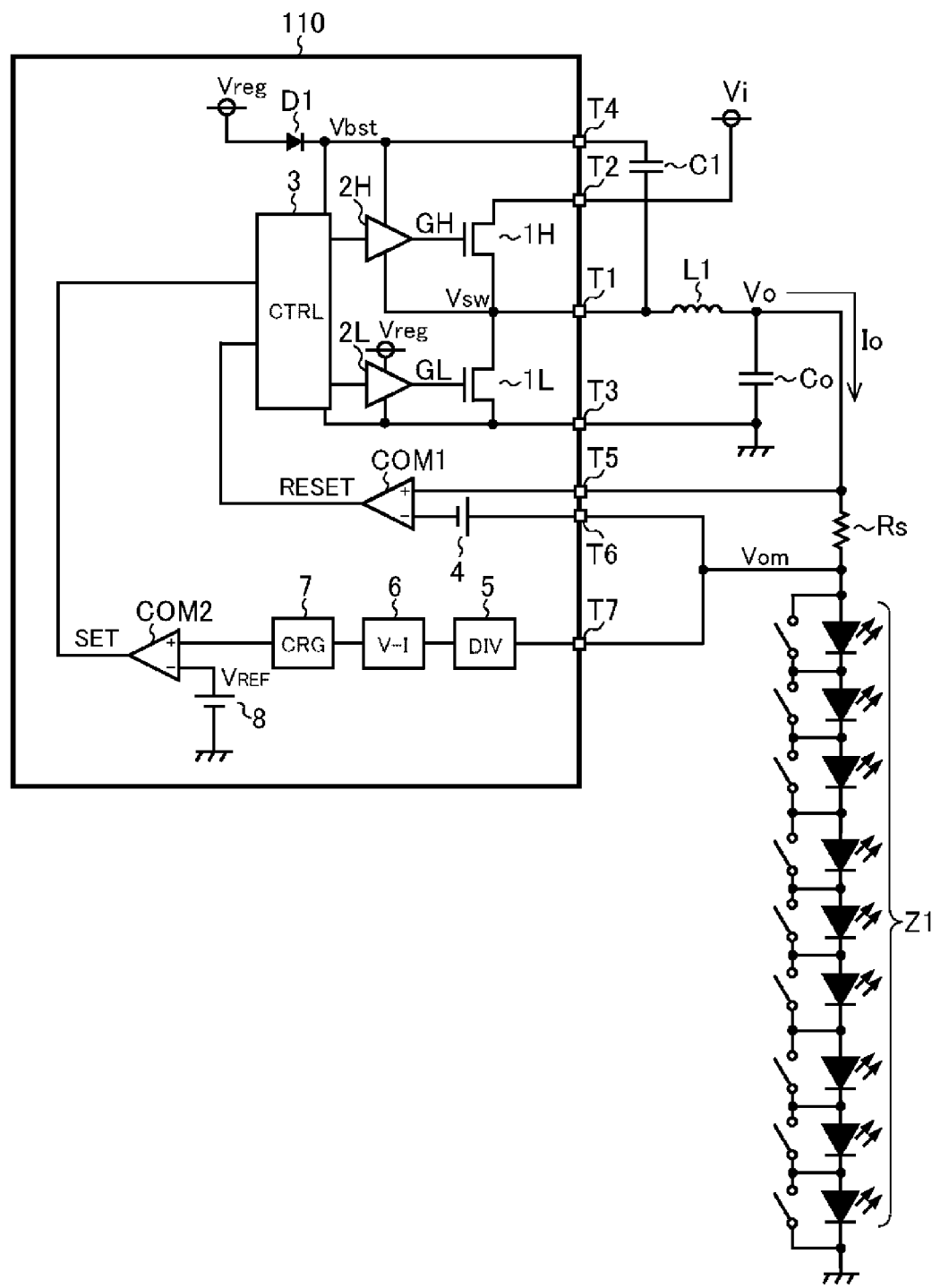
FIG. 1B is a diagram illustrating a light-emitting device of the first embodiment.

Here, as a causes of variation in the anode voltage Vom of the light-emitting element Z1, there is a change in the number of elements connected in series in the light-emitting element Z1. There is also a case of the light-emitting device as illustrated in FIG. 1B, in which a short-circuit switch is connected in parallel to each element in the light-emitting element Z1, each short-circuit switch is turned on and off so that the number of elements to be lighted in the light-emitting element Z1 can be changed, and the anode voltage Vom of the light-emitting element Z1 varies in accordance with the number of lighted elements in the light-emitting element Z1. The structure of the light-emitting device illustrated in FIG. 1B is suitable for realizing an adaptive front-lighting system (AFS) or an adaptive driving beam (ADB) in the application of headlight of a vehicle, for example.

In the light-emitting device illustrated in FIG. 1B, the substrate on which the light-emitting element drive IC 110 is mounted is separated from the substrate on which the light-emitting element Z1, the short-circuit switches, and a switch control unit (not shown) that controls the short-circuit switches, and synchronization between the light-emitting element drive IC 110 and the switch control unit cannot be usually achieved. Therefore, in order to set the number of elements to be lighted in the light-emitting element Z1 to zero, the switch control unit usually turns on all the short-circuit switches.

However, if the number of elements to be lighted in the light-emitting element Z1 is set to zero, the anode voltage Vom of the light-emitting element Z1 becomes substantially zero, and hence there is a problem that the off-time circuit does not work when using the off-time circuit illustrated in FIG. 2A. In the light-emitting device illustrated in FIG. 1B, it is preferred to use the off-time circuit illustrated in FIG. 2B, for example.

Figure 2B:
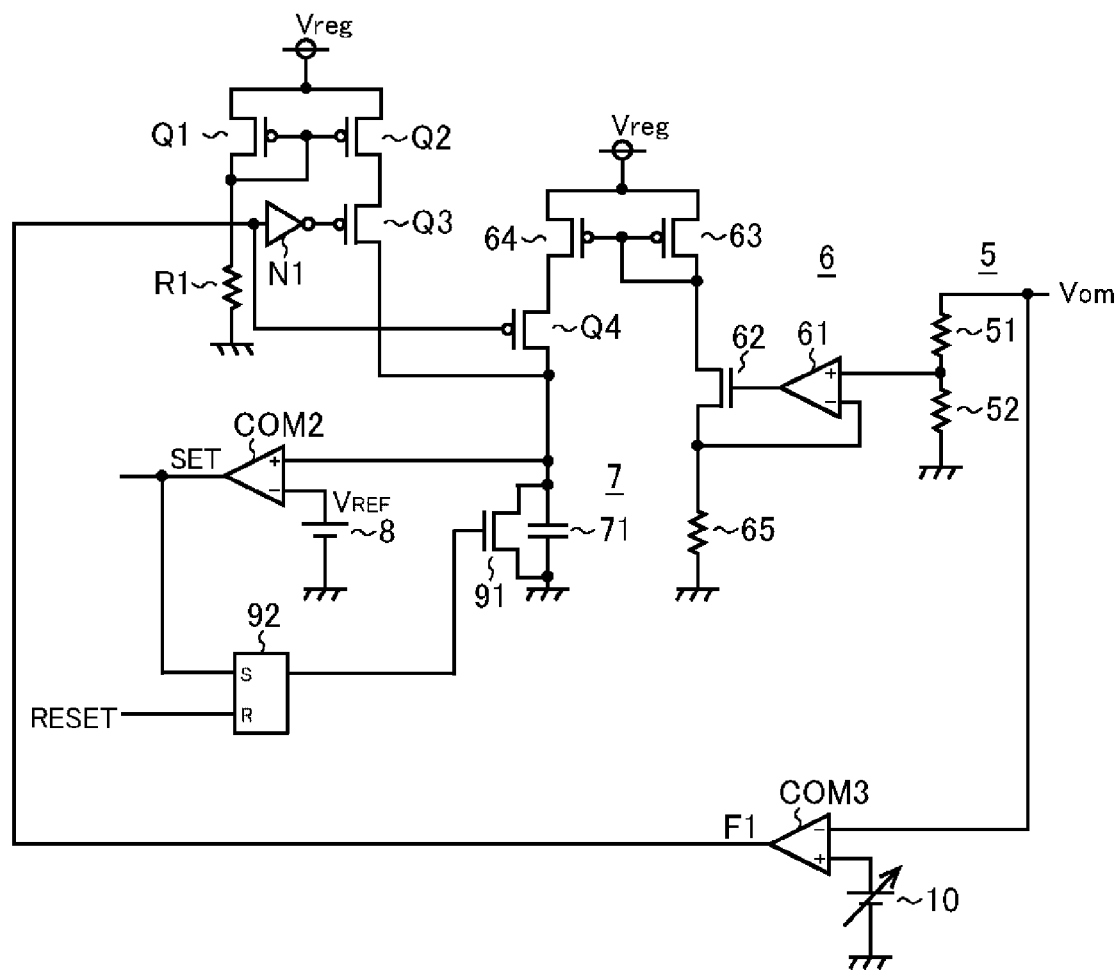
FIG. 2B is a diagram illustrating another example of the off-time circuit.

The off-time circuit illustrated in FIG. 2B has a structure in which P-channel MOS field-effect transistors Q1 to Q4, a resistor R1, and a NOT circuit N1 are added to the off-time circuit illustrated in FIG. 2A. When using the off-time circuit illustrated in FIG. 2B, the light-emitting device illustrated in FIG. 1B further includes a determination circuit constituted of comparator COM3 and a variable voltage source 10. In the determination circuit constituted of the comparator COM3 and the variable voltage source 10, when the voltage output from the variable voltage source 10 exceeds the anode voltage Vom of the light-emitting element Z1, a flag F1 output from the comparator COM3 becomes high level indicating that there is a possibility of ground fault. If the voltage output from the variable voltage source 10 is not higher than the anode voltage Vom of the light-emitting element Z1, the flag F1 output from the comparator COM3 becomes low level indicating there is no possibility of ground fault.

The transistors Q1 and Q2 constitute a current mirror circuit. The drain of the transistor Q1 is connected to the ground terminal via the resistor R1, and the drain of the transistor Q2 is connected to the first terminal of the capacitor 71 via the transistor Q3. In addition, the transistor Q4 is connected between the drain of the transistor 64 and a first terminal of the capacitor 71. Further, the gate of the transistor Q3 is connected to the output terminal of the comparator COM3 via the NOT circuit N1, and the gate of the transistor Q4 is directly connected to the output terminal of the comparator COM3. Therefore, when the flag F1 is high level, the transistor Q3 is turned on, the transistor Q4 is turned off, and the capacitor 71 is charged by the current output from the current mirror circuit constituted of the transistors Q1 and Q2. On the other hand, when the flag F1 is low level, the transistor Q3 is turned off, the transistor Q4 is turned on, and the capacitor 71 is charged by the current output from the current mirror circuit constituted of the transistors 63 and 64 similarly to the off-time circuit illustrated in FIG. 2A.

The voltage output from the variable voltage source 10 is adjusted to be lower than the anode voltage Vom of the light-emitting element Z1 when only one element of the light-emitting element Z1 is lighted and to be higher than the anode voltage Vom in the light-emitting element Z1 when every element in the light-emitting element Z1 is not lighted. As long as the voltage is obtained, which is lower than the anode voltage Vom of the light-emitting element Z1 when only one element of the light-emitting element Z1 is lighted and is higher than the anode voltage Vom in the light-emitting element Z1 when every element in the light-emitting element Z1 is not lighted, it is possible to use a constant voltage source instead of the variable voltage source 10. However, because there is a variation in forward voltages of elements in the light-emitting element Z1, it is preferred that the voltage can be adjusted using the variable voltage source 10.

Second Embodiment

Figure 3:
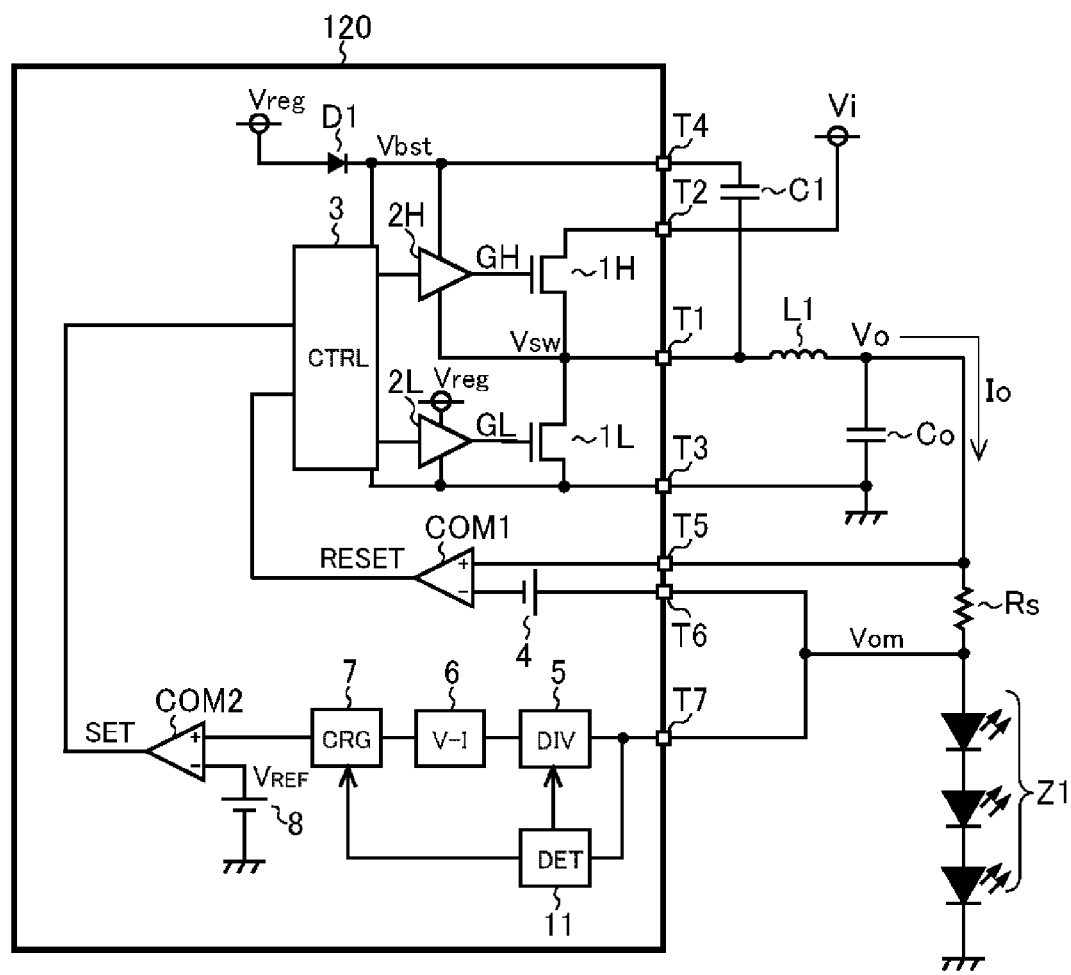
FIG. 3 is a diagram illustrating a light-emitting device of a second embodiment.

FIG. 3 is a diagram illustrating a light-emitting device of a second embodiment. Note that, in FIG. 3, the same part as in FIG. 1A is denoted by the same numeral or symbol, and detailed description thereof is omitted.

The light-emitting device illustrated in FIG. 3 has a structure in which the light-emitting element drive IC 110 in the light-emitting device illustrated in FIG. 1A is replaced by a light-emitting element drive IC 120. The light-emitting element drive IC 120 has a structure in which a detection unit 11 that detects a level of the anode voltage Vom of the light-emitting element Z1 is added to the light-emitting element drive IC 110, and an internal constant (voltage division ratio) of the voltage dividing circuit 5 and an internal constant (capacitance) of the charging unit 7 are switched according to a detection result of the detection unit 11. Note that the voltage division ratio is a value obtained by dividing the voltage after the voltage division by the voltage before the voltage division.

Because the light-emitting device illustrated in FIG. 1A has a structure in which the internal constant (voltage division ratio) of the voltage dividing circuit 5 is not switched, a difference between the maximum value and the minimum value of the current output from the voltage-current conversion circuit 6 becomes large when the anode voltage Vom of the light-emitting element Z1 is largely varied, and accuracy of the current output from the voltage-current conversion circuit 6 may be deteriorated, if the anode voltage Vom of the light-emitting element Z1 is low. In contrast, the light-emitting device illustrated in FIG. 3 has a structure in which the internal constant (voltage division ratio) of the voltage dividing circuit 5 and the internal constant (capacitance) of the charging unit 7 are switched in accordance with a detection result of the detection unit 11, and thus, if the anode voltage Vom of the light-emitting element Z1 is high, by setting the internal constant (voltage division ratio) of the voltage dividing circuit 5 to be small, even if the anode voltage Vom of the light-emitting element Z1 varies largely, the difference between the maximum value and the minimum value of the current output from the voltage-current conversion circuit 6 can be decreased. Thus, it is possible to suppress a decrease in accuracy of the current output from the voltage-current conversion circuit 6 when the anode voltage Vom of the light-emitting element Z1 is low. Note that, in order to prevent a variation in setting of the off-time (a proportionality constant in a proportional relationship between the anode voltage Vom of the light-emitting element Z1 and the off-time) even if the internal constant (voltage division ratio) of the voltage dividing circuit 5 and the internal constant (capacitance) of the charging unit 7 are switched, it is preferred that the product of the internal constant (voltage division ratio) of the voltage dividing circuit 5 and the internal constant (capacitance) of the charging unit 7 should be always constant.

Figure 4:
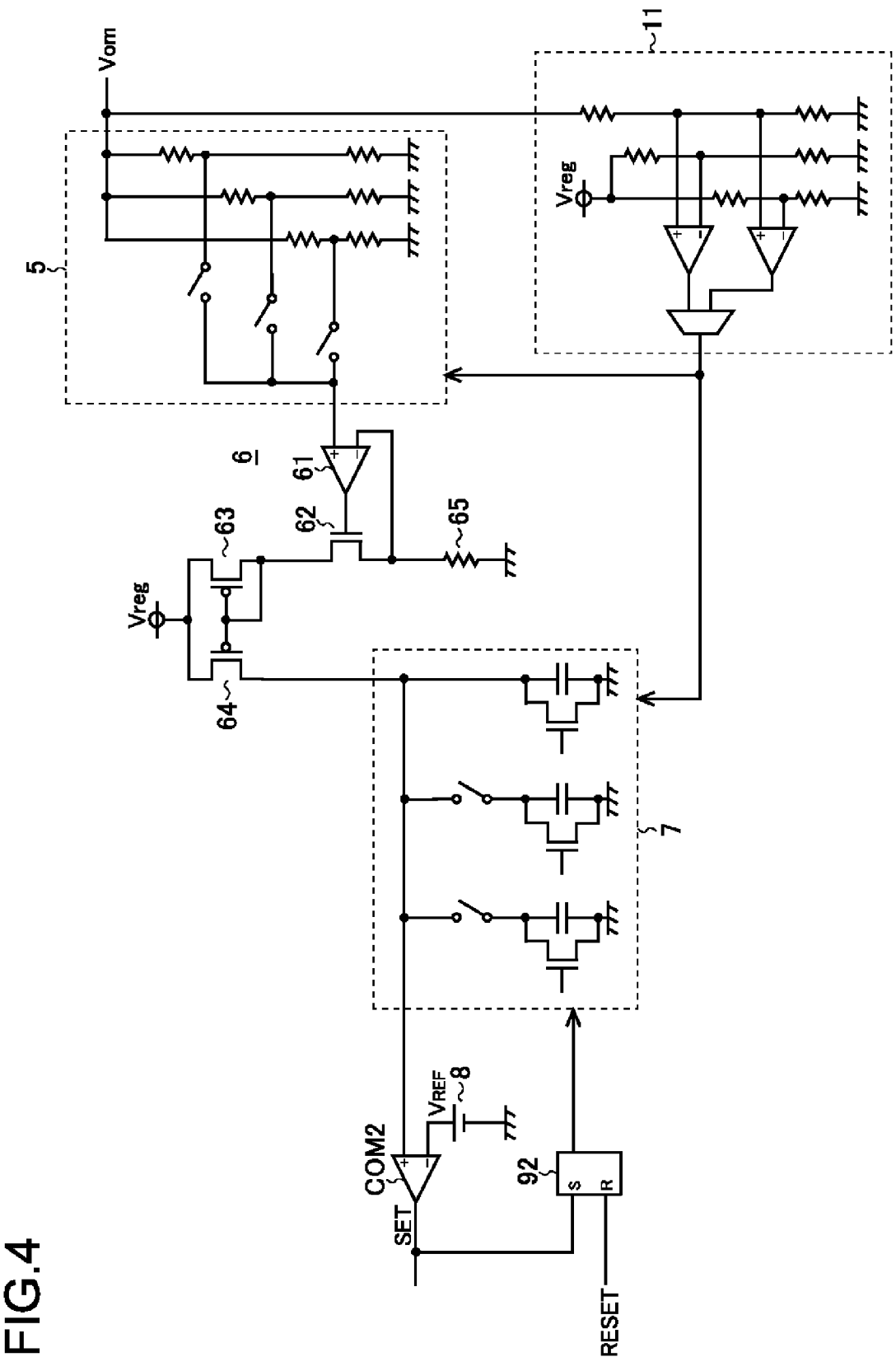
FIG. 4 is a diagram illustrating an example of the off-time circuit.

FIG. 4 is a diagram illustrating an example of the off-time circuit constituted of the voltage dividing circuit 5, the voltage-current conversion circuit 6, the charging unit 7, the comparator COM2, the reference voltage source 8, and the detection circuit 11.

The detection circuit 11 outputs a selection signal, which corresponds to a comparison result between the divided voltage of the anode voltage Vom of the light-emitting element Z1 and a first divided voltage of the constant voltage Vreg, and a comparison result between the divided voltage of the anode voltage Vom of the light-emitting element Z1 and a second divided voltage of the constant voltage Vreg (lower than the first divided voltage of the constant voltage Vreg).

If the anode voltage Vom of the light-emitting element Z1 is a high level (the divided voltage of the anode voltage Vom of the light-emitting element Z1 is higher than the first divided voltage of the constant voltage Vreg, and the divided voltage of the anode voltage Vom of the light-emitting element Z1 is higher than the second divided voltage of the constant voltage Vreg), the detection circuit 11 outputs a first selection signal. In addition, if the anode voltage Vom of the light-emitting element Z1 is a medium level (the divided voltage of the anode voltage Vom of the light-emitting element Z1 is lower than the first divided voltage of the constant voltage Vreg, and the divided voltage of the anode voltage Vom of the light-emitting element Z1 is higher than the second divided voltage of the constant voltage Vreg), the detection circuit 11 outputs a second selection signal. In addition, if the anode voltage Vom of the light-emitting element Z1 is a low level (the divided voltage of the anode voltage Vom of the light-emitting element Z1 is lower than the first divided voltage of the constant voltage Vreg, and the divided voltage of the anode voltage Vom of the light-emitting element Z1 is lower than the second divided voltage of the constant voltage Vreg), the detection circuit 11 outputs a third selection signal.

The voltage dividing circuit 5 generates three divided voltages of the anode voltage Vom of the light-emitting element Z1 having different voltage division ratios. When the detection circuit 11 supplies the first selection signal, the voltage dividing circuit 5 outputs the divided voltage of the smallest voltage division ratio. When the detection circuit 11 supplies the second selection signal, the voltage dividing circuit 5 outputs the divided voltage of the medium voltage division ratio. When the detection circuit 11 supplies the third selection signal, the voltage dividing circuit 5 outputs the divided voltage of the largest voltage division ratio.

The charging unit 7 is a circuit in which a combined capacitance is switched by on and off of switches. When the detection circuit 11 supplies the first selection signal, the combined capacitance of the charging unit 7 becomes largest. When the detection circuit 11 supplies the second selection signal, the combined capacitance of the charging unit 7 becomes a medium capacitance. When the detection circuit 11 supplies the third selection signal, the combined capacitance of the charging unit 7 becomes smallest.

Third Embodiment

Figure 5:
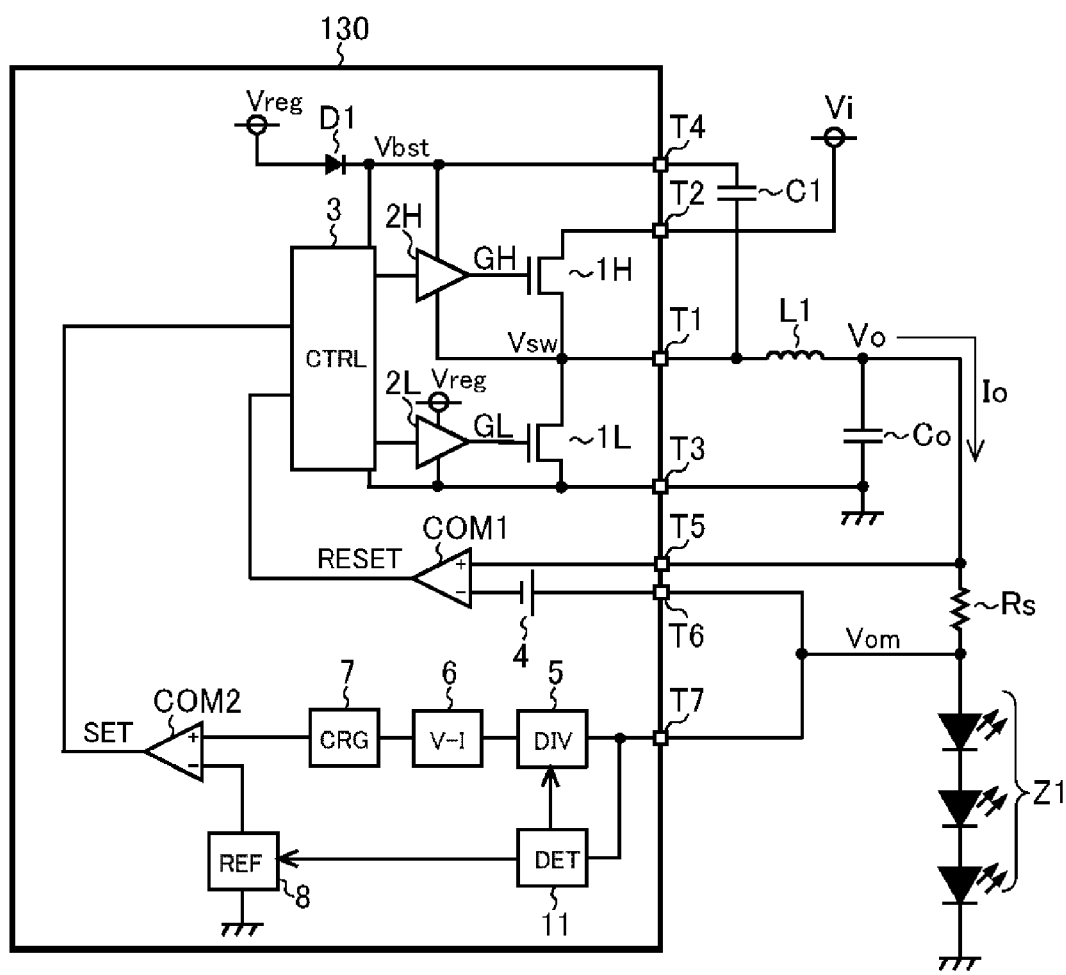
FIG. 5 is a diagram illustrating a light-emitting device of a third embodiment.

FIG. 5 is a diagram illustrating a light-emitting device of a third embodiment. Note that, in FIG. 5, the same part as in FIG. 1A is denoted by the same numeral or symbol, and detailed description thereof is omitted.

The light-emitting device illustrated in FIG. 5 has a structure in which the light-emitting element drive IC 110 in the light-emitting device illustrated in FIG. 1A is replaced by the light-emitting element drive IC 130. The light-emitting element drive IC 130 has a structure in which the detection unit 11 that detects a level of the anode voltage Vom of the light-emitting element Z1 is added to the light-emitting element drive IC 110, and the internal constant (voltage division ratio) of the voltage dividing circuit 5 and the internal constant of the reference voltage source 8 are switched according to a detection result of the detection unit 11.

Because the light-emitting device illustrated in FIG. 1A has a structure in which the internal constant (voltage division ratio) of the voltage dividing circuit 5 is not switched, the difference between the maximum value and the minimum value of the current output from the voltage-current conversion circuit 6 becomes large when the anode voltage Vom of the light-emitting element Z1 is largely varied, and accuracy of the current output from the voltage-current conversion circuit 6 may be deteriorated, if the anode voltage Vom of the light-emitting element Z1 is low. In contrast, the light-emitting device illustrated in FIG. 5 has a structure in which the internal constant (voltage division ratio) of the voltage dividing circuit 5 and the internal constant of the reference voltage source 8 are switched in accordance with a detection result of the detection unit 11, and thus, if the anode voltage Vom of the light-emitting element Z1 is high, by setting the internal constant (voltage division ratio) of the voltage dividing circuit 5 to be small, even if the anode voltage Vom of the light-emitting element Z1 varies largely, the difference between the maximum value and the minimum value of the current output from the voltage-current conversion circuit 6 can be decreased. Thus, it is possible to suppress a decrease in accuracy of the current output from the voltage-current conversion circuit 6 when the anode voltage Vom of the light-emitting element Z1 is low. Note that, in order to prevent a variation in setting of the off-time (a proportionality constant in a proportional relationship between the anode voltage Vom of the light-emitting element Z1 and the off-time) even if the internal constant (voltage division ratio) of the voltage dividing circuit 5 and the internal constant of the reference voltage source 8 are switched, it is preferred that the product of the internal constant (voltage division ratio) of the voltage dividing circuit 5 and the reference voltage $V_{REF}$ output from the reference voltage source 8 should be always constant.

Figure 6:
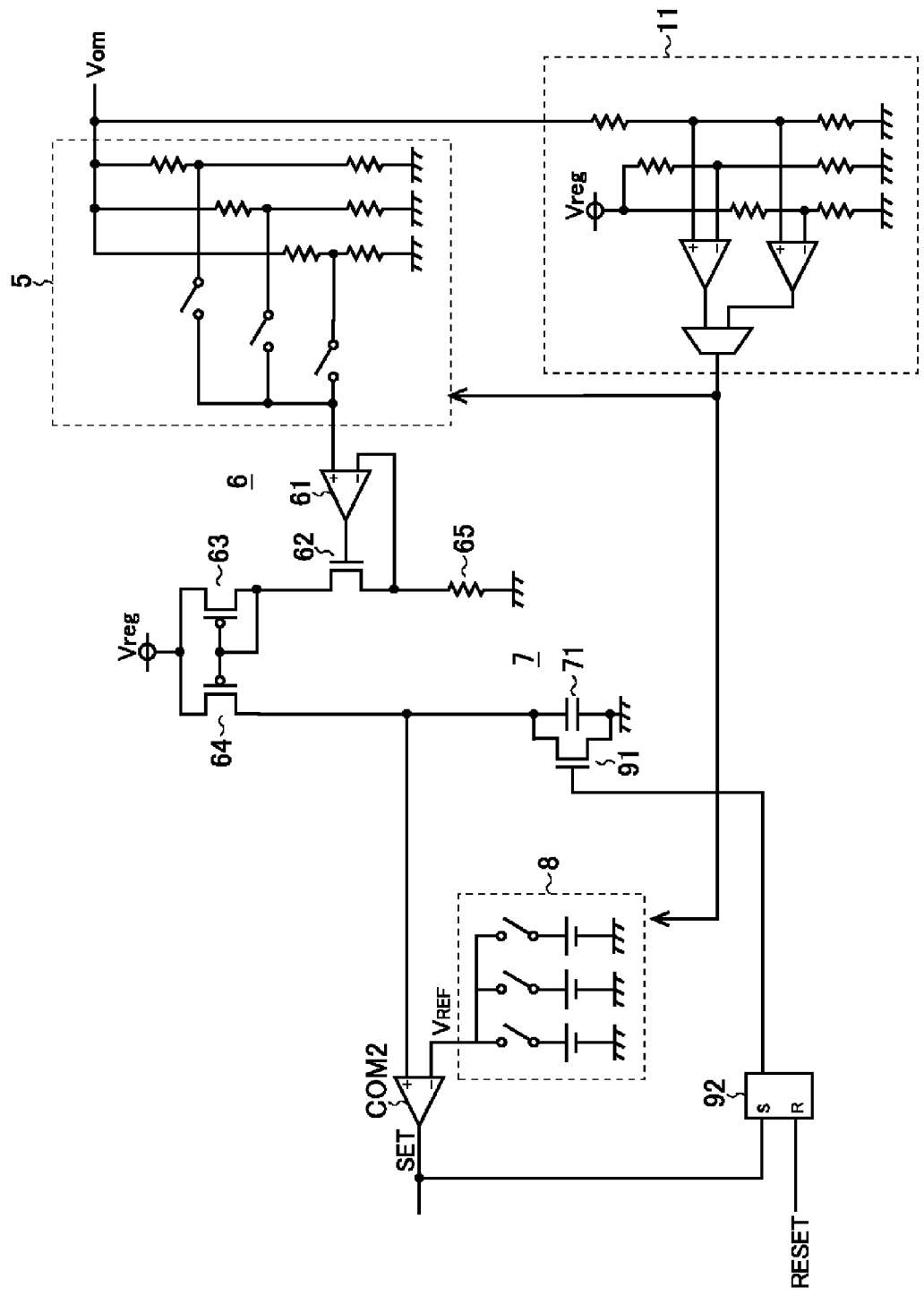
FIG. 6 is a diagram illustrating an example of the off-time circuit.

FIG. 6 is a diagram illustrating an example of the off-time circuit constituted of the voltage dividing circuit 5, the voltage-current conversion circuit 6, the charging unit 7, the comparator COM2, the reference voltage source 8, and the detection circuit 11.

If the anode voltage Vom of the light-emitting element Z1 is a high level (the divided voltage of the anode voltage Vom of the light-emitting element Z1 is higher than the first divided voltage of the constant voltage Vreg, and the divided voltage of the anode voltage Vom of the light-emitting element Z1 is higher than the second divided voltage of the constant voltage Vreg, the detection circuit 11 outputs the first selection signal. In addition, if the anode voltage Vom of the light-emitting element Z1 is a medium level (the divided voltage of the anode voltage Vom of the light-emitting element Z1 is lower than the first divided voltage of the constant voltage Vreg, and the divided voltage of the anode voltage Vom of the light-emitting element Z1 is higher than the second divided voltage of the constant voltage Vreg), the detection circuit 11 outputs the second selection signal. In addition, if the anode voltage Vom of the light-emitting element Z1 is a low level (the divided voltage of the anode voltage Vom of the light-emitting element Z1 is lower than the first divided voltage of the constant voltage Vreg, and the divided voltage of the anode voltage Vom of the light-emitting element Z1 is lower than the second divided voltage of the constant voltage Vreg), the detection circuit 11 outputs the third selection signal.

The voltage dividing circuit 5 generates three divided voltages of the anode voltage Vom of the light-emitting element Z1 having different voltage division ratios. When the detection circuit 11 supplies the first selection signal, the voltage dividing circuit 5 outputs the divided voltage of the smallest voltage division ratio. When the detection circuit 11 supplies the second selection signal, the voltage dividing circuit 5 outputs the divided voltage of the medium voltage division ratio. When the detection circuit 11 supplies the third selection signal, the voltage dividing circuit 5 outputs the divided voltage of the largest voltage division ratio.

The reference voltage source 8 is a circuit in which a value of the reference voltage $V_{REF}$ is switched by on and off of switches. When the detection circuit 11 supplies the first selection signal, the value of the reference voltage $V_{REF}$ becomes largest. When the detection circuit 11 supplies the second selection signal, the value of the reference voltage $V_{REF}$ becomes a medium voltage value. When the detection circuit 11 supplies the third selection signal, the value of the reference voltage $V_{REF}$ becomes smallest.

<Applications>

Figure 7:
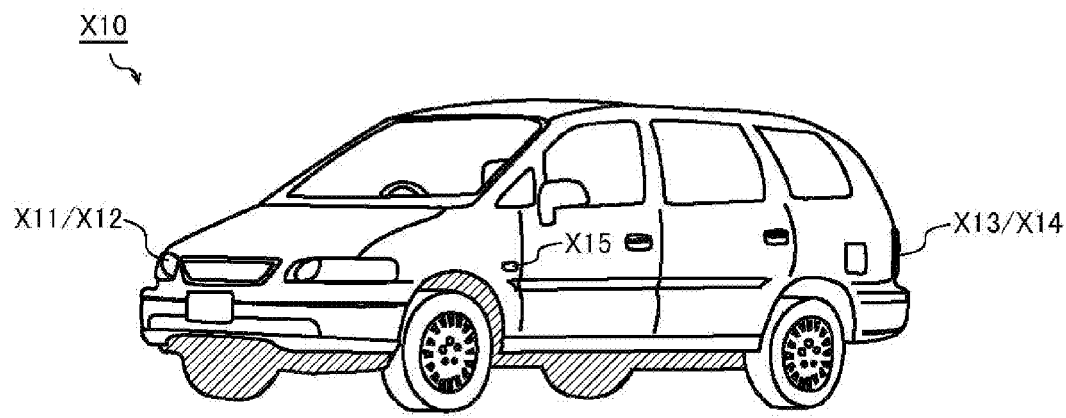
FIG. 7 is an external view (front) of a vehicle equipped with the light-emitting device.
Figure 8:
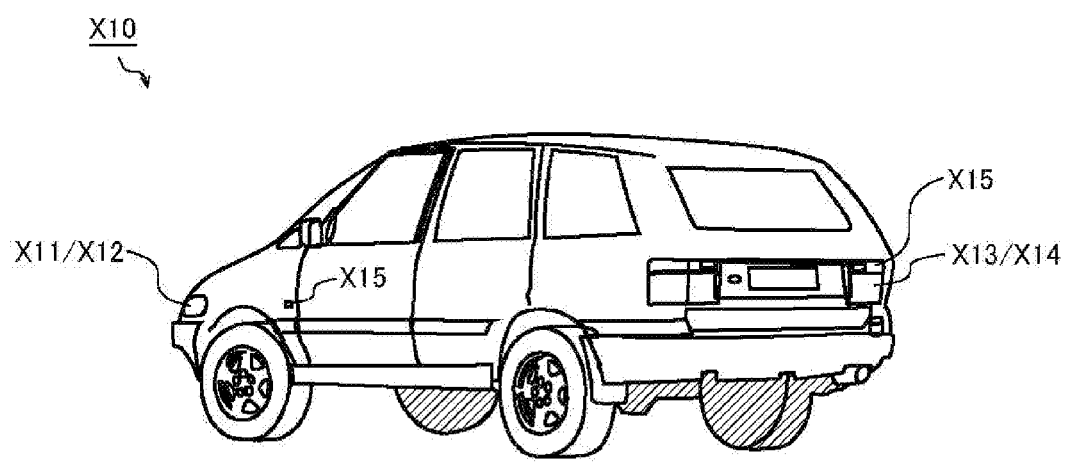
FIG. 8 is an external view (rear) of the vehicle equipped with the light-emitting device.

The light-emitting device of each embodiment described above can be appropriately used as a headlight (including appropriately a high beam light, a low beam light, a small lamp, a fog lamp, and the like) X11, a day and night running light source (DRL) X12, a tail lamp (including appropriately a small lamp, a back lamp, and the like) X13, a stop lamp X14, a turn lamp X15, and the like of a vehicle X10, for example, as illustrated in FIGS. 7 and 8.

Figure 9:
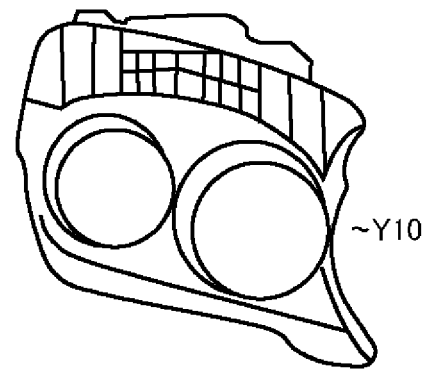
FIG. 9 is an external view of an LED headlight module.
Figure 10:
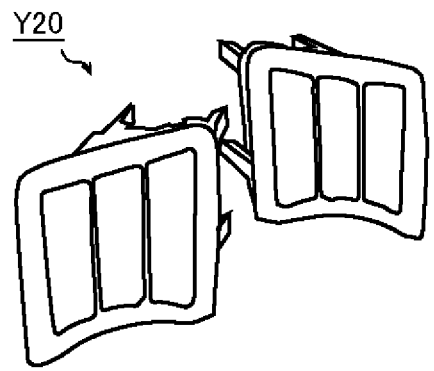
FIG. 10 is an external view of an LED turn lamp module.
Figure 11:
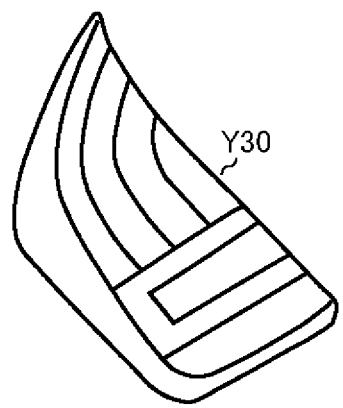
FIG. 11 is an external view of an LED rear lamp module.
Figure 12:
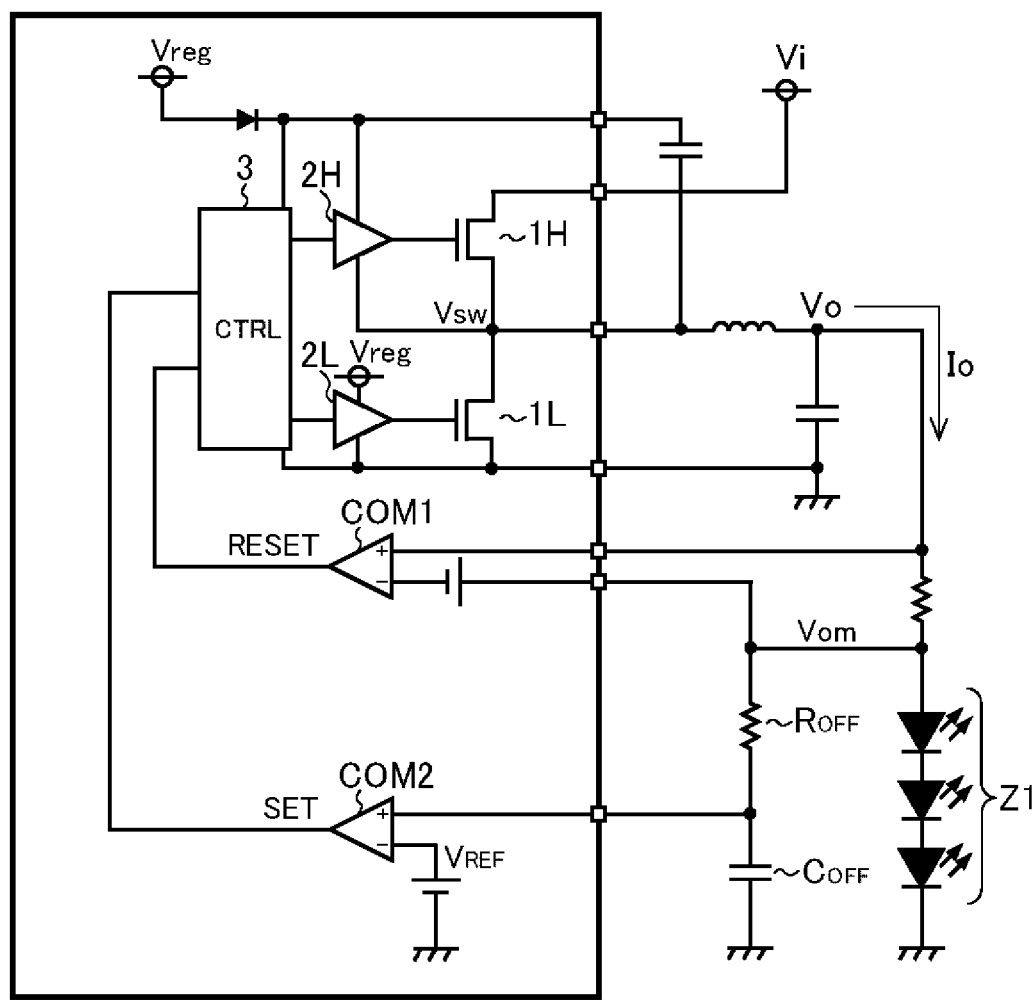
FIG. 12 is a diagram illustrating an example of the light-emitting device.
Figure 13A:
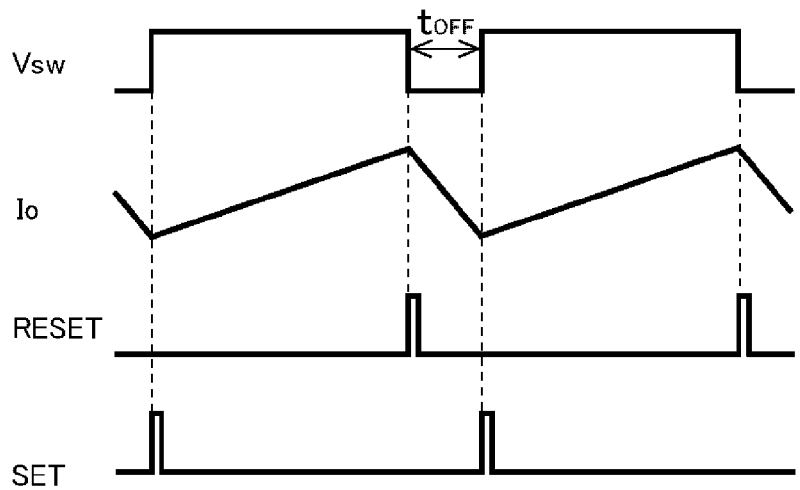
FIG. 13A is a time chart for describing an operation example of the light-emitting device illustrated in FIG. 12.
Figure 13B:
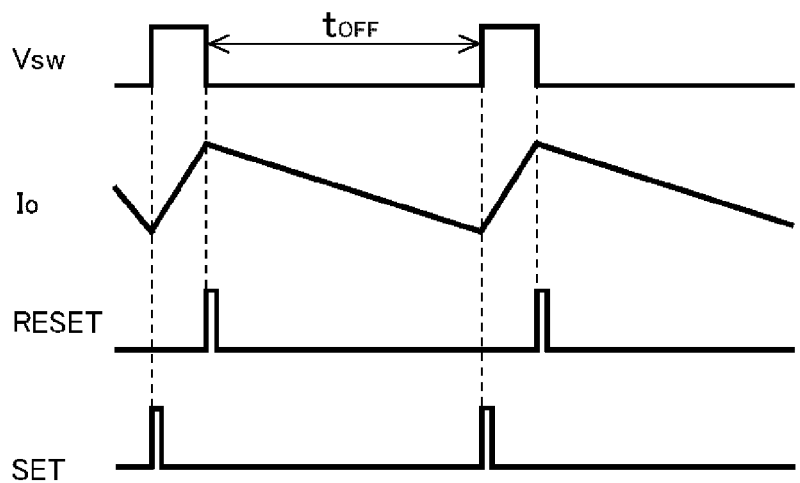
FIG. 13B is a time chart for describing an operation example of the light-emitting device illustrated in FIG. 12.
Figure 14:
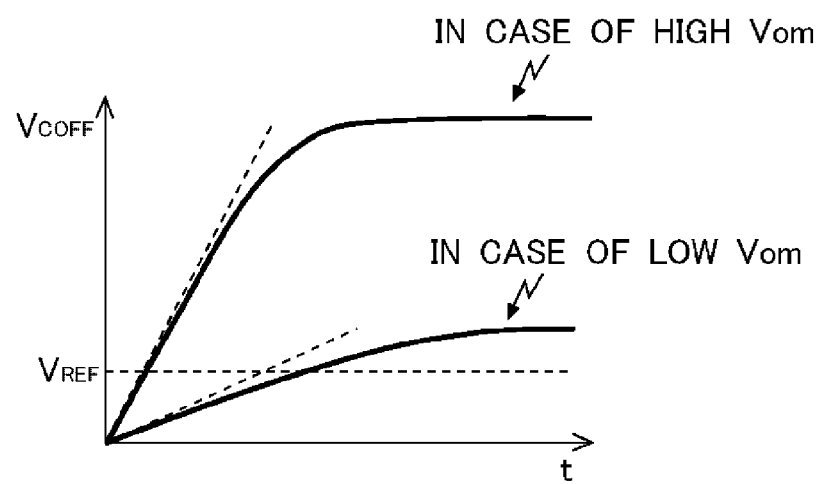
FIG. 14 is a time chart illustrating an integrated value of an anode voltage of a light-emitting element determined by an RC integral circuit.

Note that a light-emitting element drive IC 11A may be provided as a module (such as an LED headlight module Y10 in FIG. 9, an LED turn lamp module Y20 in FIG. 10, or an LED rear lamp module Y30 in FIG. 11) together with an external components (such as the output capacitor Co, the capacitor C1, the coil L1, and the sense resistor Rs) and the light-emitting element Z1 to be driven, or may be provided as a single IC (the light-emitting element drive IC 110 to 130) that is a semi-product separately from the external components (such as the output capacitor Co, the capacitor C1, the coil L1, and the sense resistor Rs) and the light-emitting element Z1 to be driven.

In addition, the light-emitting device of each embodiment described above can be used also as a backlight of a display device, for example.

<Other Variation>

Note that, in the embodiments described above, the structure in which the light emitting diode is used as the light-emitting element is exemplified, but the present invention is not limited to this structure. For example, it is possible to use an organic electro-luminescence (EL) element as the light-emitting element.

In addition, various technical features disclosed in this specification can be variously modified within the scope of the technical invention without deviating therefrom, besides the embodiments described above. For example, mutual substitution between a bipolar transistor and a MOS field-effect transistor, and logic level inversion of any signal can be arbitrarily performed. In other words, the embodiments described above are merely examples in every aspect and should not be interpreted as limitations. The technical scope of the present invention is defined not by the above description of the embodiments but by the claims, and should be understood to include all modifications within meaning and scope equivalent to the claims.

EXPLANATION OF NUMERALS

1H N-channel MOS field-effect transistor (upper-side transistor)
1L N-channel MOS field-effect transistor (lower-side transistor)
2H upper-side driver
2L lower-side driver
3 control unit
4 constant voltage source
5 voltage dividing circuit
6 voltage-current conversion circuit
7 charging unit
8 reference voltage source
10 variable voltage source
11 detection circuit
51, 52, 65 resistor
61 amplifier
62, 91 N-channel MOS field-effect transistor
63, 64, Q1 to Q4 P-channel MOS field-effect transistor
71, C1 capacitor
92 SR flip-flop
110, 120, 130 light-emitting element drive IC
COM1 to COM3 comparator
Co output capacitor
C1 capacitor
D1 diode
L1 coil
N1 NOT circuit
R1 resistor
Rs sense resistor
T1 to T7 external terminal
X10 vehicle
X11 headlight
X12 day and night running light source (DRL)
X13 tail lamp
X14 stop lamp
X15 turn lamp
Y10 LED headlight module
Y20 LED turn lamp module
Y30 LED rear lamp module
Z1 light-emitting element (light emitting diode)

The invention claimed is:

1. A light-emitting element driving device comprising:
a reset signal generation unit arranged to generate a reset signal in accordance with current flowing in at least one light-emitting element;
a set signal generation unit arranged to generate a set signal in accordance with an anode voltage of the at least one light-emitting element; and
an output voltage supply unit arranged to generate an output voltage from an input voltage in accordance with the reset signal and the set signal so as to supply the output voltage to the at least one light-emitting element, wherein
the set signal generation unit includes a current generation unit arranged to generate current according to the anode voltage of the at least one light-emitting element, a charging unit arranged to charge the current generated by the current generation unit, and a comparing unit arranged to generate the set signal in accordance with a comparison result between a charging voltage of the charging unit and a reference voltage.

2. The light-emitting element driving device according to claim 1, further comprising a detection unit arranged to detect a level of the anode voltage of the at least one light-emitting element, wherein
an internal constant of the set signal generation unit is switched in accordance with a detection result of the detection unit.

3. The light-emitting element driving device according to claim 2, wherein the current generation unit includes a voltage dividing unit arranged to divide the anode voltage of the at least one light-emitting element, and switches a voltage division ratio of the voltage dividing unit and a capacitance of the charging unit in accordance with the detection result of the detection unit.

4. The light-emitting element driving device according to claim 3, wherein the product of the voltage division ratio of the voltage dividing unit and the capacitance of the charging unit is constant.

5. The light-emitting element driving device according to claim 2, wherein the set signal generation unit further includes a reference voltage source arranged to output the reference voltage, and the current generation unit includes a voltage dividing unit arranged to divide the anode voltage of the at least one light-emitting element, and switches a voltage division ratio of the voltage dividing unit and the reference voltage in accordance with the detection result of the detection unit.

6. The light-emitting element driving device according to claim 5, wherein the product of the voltage division ratio of the voltage dividing unit and the reference voltage is constant.

7. The light-emitting element driving device according to claim 1, wherein the output voltage generation unit includes
- an upper-side transistor and a lower-side transistor connected in series between an application terminal of the input voltage and the ground terminal, the connection node thereof being connected to the output capacitor via a coil,
- an upper-side driver and a lower-side driver arranged to generate drive control signals of the upper-side transistor and the lower-side transistor, respectively, and
- a control unit arranged to control the upper-side driver and the lower-side driver to turn on and off the upper-side transistor and the lower-side transistor, respectively, in accordance with the reset signal and the set signal.

8. A light-emitting device comprising:
- the light-emitting element driving device according to claim 1; and
- at least one light-emitting element driven by the light-emitting element driving device.

9. The light-emitting device according to claim 8, further comprising at least one switch connected in parallel to each element of the at least one light-emitting element, wherein,
- the set signal generation unit further includes a current source arranged to supply current to the charging unit if every switch of the at least one switch is turned on.

10. The light-emitting device according to claim 8, wherein the light-emitting element is a light emitting diode or an organic EL element.

11. The light-emitting device according to claim 10, wherein the light-emitting device is used as an in-vehicle lamp.

12. The light-emitting device according to claim 11, wherein the light-emitting device is mounted in a vehicle as a headlight module, a turn lamp module, or a rear lamp module.

13. A vehicle comprising the light-emitting device according to claim 11.

14. A vehicle according to claim 13, wherein the light-emitting device is used as at least one of a headlight, a day and night running light source, a tail lamp, a stop lamp, and a turn lamp.

15. A light-emitting device comprising:
- the light-emitting element driving device according to claim 2; and
- at least one light-emitting element driven by the light-emitting element driving device.

16. A light-emitting device comprising:
- the light-emitting element driving device according to claim 3; and
- at least one light-emitting element driven by the light-emitting element driving device.

17. A light-emitting device comprising:
- the light-emitting element driving device according to claim 4; and
- at least one light-emitting element driven by the light-emitting element driving device.

18. A light-emitting device comprising:
- the light-emitting element driving device according to claim 5; and
- at least one light-emitting element driven by the light-emitting element driving device.

19. A light-emitting device comprising:
- the light-emitting element driving device according to claim 6; and
- at least one light-emitting element driven by the light-emitting element driving device.

20. A light-emitting device comprising:
- the light-emitting element driving device according to claim 7; and
- at least one light-emitting element driven by the light-emitting element driving device.

* * * * *